United States Patent
Massingill

(10) Patent No.: US 7,489,517 B2
(45) Date of Patent: Feb. 10, 2009

(54) DIE DOWN SEMICONDUCTOR PACKAGE

(76) Inventor: Thomas Joel Massingill, 170 Northridge Dr., Scotts Valley, CA (US) 95066

( * ) Notice: Subject to any disclaimer, the term of this patent is extended or adjusted under 35 U.S.C. 154(b) by 206 days.

(21) Appl. No.: 11/096,542

(22) Filed: Apr. 1, 2005

(65) Prior Publication Data

US 2005/0218514 A1 Oct. 6, 2005

Related U.S. Application Data

(60) Provisional application No. 60/559,788, filed on Apr. 5, 2004.

(51) Int. Cl.
*H05K 7/00* (2006.01)

(52) U.S. Cl. .................. 361/760; 361/762; 361/763; 361/764; 361/765; 361/767; 174/263

(58) Field of Classification Search .......... 361/760, 361/516, 770–774, 762–767; 174/259–262; 257/700–704, 728–730, 778–780, 737

See application file for complete search history.

(56) References Cited

U.S. PATENT DOCUMENTS

| | | | | |
|---|---|---|---|---|
| 4,509,096 A | * | 4/1985 | Baldwin et al. | 361/719 |
| 5,027,191 A | * | 6/1991 | Bourdelaise et al. | 257/735 |
| 5,420,460 A | * | 5/1995 | Massingill | 257/693 |
| 5,894,410 A | * | 4/1999 | Barrow | 361/760 |
| 6,147,409 A | * | 11/2000 | Hsia et al. | 257/763 |
| 6,208,502 B1 | * | 3/2001 | Hudis et al. | 361/503 |
| 6,274,391 B1 | * | 8/2001 | Wachtler et al. | 438/6 |
| 6,781,849 B2 | * | 8/2004 | Baek et al. | 361/760 |
| 6,795,299 B2 | * | 9/2004 | Naito | 361/509 |
| 6,804,108 B2 | * | 10/2004 | Nanjundiah et al. | 361/502 |
| 6,847,527 B2 | * | 1/2005 | Sylvester et al. | 361/763 |
| 6,903,916 B2 | * | 6/2005 | Yamazaki et al. | 361/301.4 |
| 7,061,122 B2 | * | 6/2006 | Kim et al. | 257/778 |
| 7,087,991 B2 | * | 8/2006 | Chen et al. | 257/700 |
| 7,239,024 B2 | * | 7/2007 | Massingill | 257/778 |
| 2005/0002167 A1 | * | 1/2005 | Hsuan et al. | 361/760 |
| 2005/0207131 A1 | * | 9/2005 | Prokofiev et al. | 361/760 |

* cited by examiner

*Primary Examiner*—Jeremy C Norris
*Assistant Examiner*—Hoa C Nguyen
(74) *Attorney, Agent, or Firm*—Central Coast Patent Agency, Inc.

(57) ABSTRACT

A semiconductor package is disclosed for an integrated circuit die (52). The integrated circuit die is electrically connected to the package substrate by either die solder balls (53a), or wirebonds (53b). The package substrate (50), a single sided printed wiring board, has a thick metal core (100), consisting of a base metal, a core capacitor, and one or more thin build up layers.

8 Claims, 5 Drawing Sheets

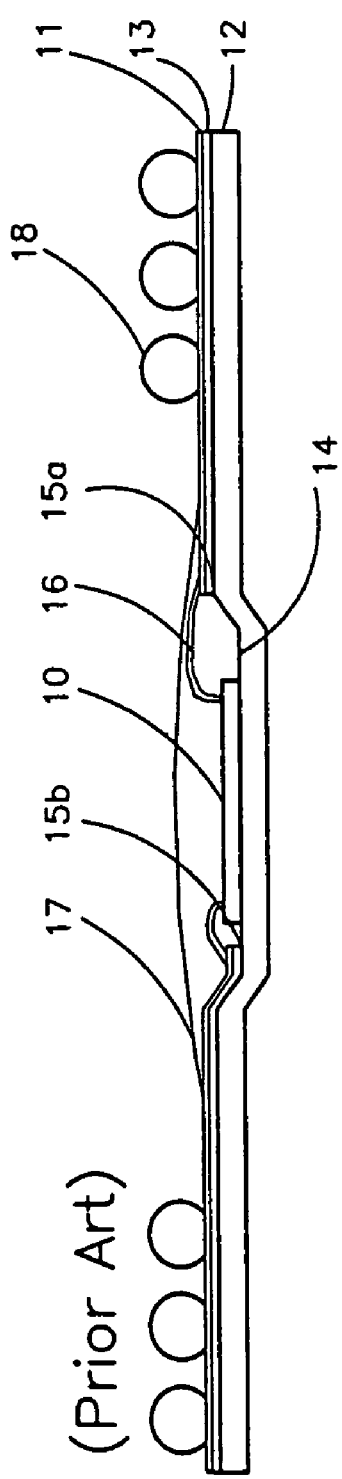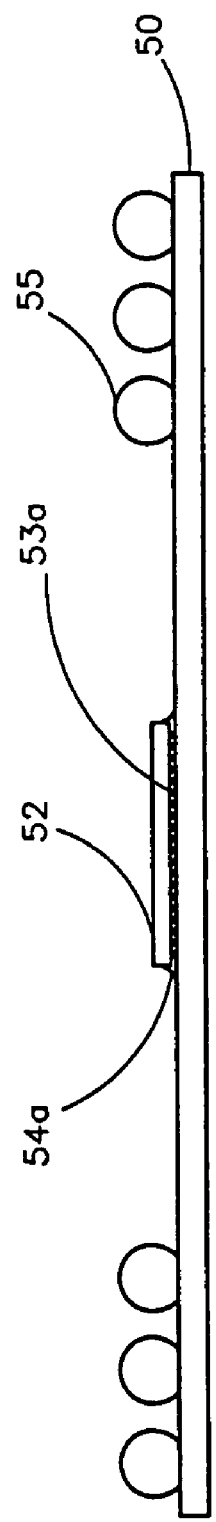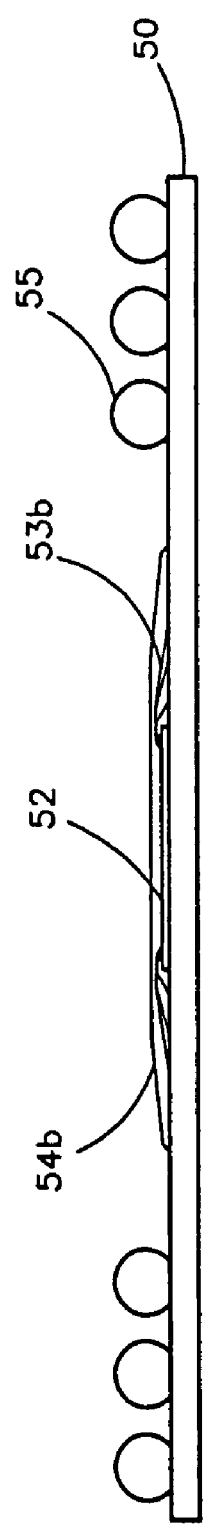

DIE DOWN SEMICONDUCTOR PACKAGE

CROSS-REFERENCE TO RELATED APPLICATIONS

This application claims the benefit of PPA No. 60/559,788, filed Apr. 5, 2004 by the present inventor.

FEDERALLY SPONSORED RESEARCH

Not applicable

SEQUENCE LISTING OR PROGRAM

Not applicable

FIELD OF THE INVENTION

This invention relates to ball grid array packages for semiconductor devices, and more particularly to thin cavity down ball grid array packages for either wirebond or solder ball attached semiconductor integrated circuits.

BACKGROUND OF THE INVENTION

A semiconductor package mounts an integrated circuit die, and provides electrical and thermal connections between the die and an electronic subsystem, while also providing mechanical and environmental protection to the die. A ball grid array package performs these functions by mounting the die on a substrate. The electrical pads of the die are attached to conductive traces on the substrate. Electrical connections between the die and the substrate have been made by wirebond, solder balls, or TAB. The conductive traces on the substrate fanout from the die to an array of package pads. Each package pad has a package solder ball, which makes electrical contact to a pad on an electronic subsystem circuit board. The substrate is mounted flush to the circuit board, separated by the diameter of the package solder balls. The substrate has been fabricated in various technologies; such as printed wiring board, multilayer ceramic, or polyimide flex circuit.

A known problem with ball grid array package is mechanical fatigue of the package solder balls. There is a thermal coefficient of expansion (TCE) mismatch between the package and the circuit board. During power on/off cycles the package and board heat at different rates, and operate at different temperatures, so their expansion and contraction is not uniform. The difference in expansion causes strain across the package solder balls, resulting in reliability fails from fatigue. It is advantageous to match the TCE of the package to the TCE of the circuit board, thereby minimizing differences in expansion and the strain across the solderballs and reducing reliability failures from fatigue.

In a cavity up design the die is mounted on one side of the substrate and electrical connections to the circuit board are made on the opposite side of the substrate. The electrical connections between the die and the substrate are made by wirebond, TAB or solder balls. As the electrical connections to the die and the circuit board are on opposite sides, it is necessary to include and provide electrical vias through, and connecting both sides of the substrate. As the pitch of the array of package pads is reduced from 1.27 mm or 1.0 mm to 0.8 mm, 0.65 mm, or 0.5 mm, the through via consumes a larger percentage of area on the substrate. This blocks the routing of the conductive traces, and requires the use of a more expensive substrate technology.

For solder ball attached die there is also a TCE mismatch, this time between the die and the substrate. Again, it is advantageous to match both TCEs, the TCE of the die to the TCE of the substrate to reduce the fatigue failure of the die solder balls, and improve reliability. However, the TCE of a silicon die is 2 ppm/C and the TCE of a typical circuit board is 18 ppm/C, so it is not possible to match the TCE of the substrate to both the die and the circuit board. However it is beneficial to be able to engineer and design the TCE of the substrate to obtain optimum reliability.

Also for a solder ball attached die, the back of the die is exposed and a heatspreader may be attached to improve the thermal performance. The structure (substrate/die solder balls/die/adhesive/heatspreader) sandwiches the die between the substrate and the heatspreader. This sandwich structure is mechanically complex, and the components have different thermal TCE and often operate at different temperatures. Compared to a structure without a heatspreader, there is more stress on the die solder balls in the sandwich structure during thermal cycles and an increase in reliability failures. Again, it is beneficial to be able to engineer and design the TCE of the substrate to obtain optimum reliability.

There is a trade-off in adjusting the TCE of the substrate to match the die for improved die solder ball reliability and to match the circuit board for package solder ball reliability. Key factors when evaluating fatigue are the attached area (size of die and package) and the diameter of the solder balls (both die and package), which provide the separation between materials with different TCEs. When the pitch on the solder balls (die or package) is reduced, the diameter of the solder balls must also be reduced, and the distance is less between the materials with different TCEs. This reduced distance increases the stress on the solderballs, and therefore will cause higher fatigue for a given TCE mismatch. Therefore as technology shrinks it becomes increasingly beneficial to have the ability to engineer and design the TCE of the substrate for an optimum reliability.

In a cavity down design the same side of the package is used to mount the die and to make electrical connections to the circuit board. However, as the package is mounted flush to the circuit board, there is limited space to contain the integrated circuit die 10. Typically a hole is stamped, punched, or milled in the substrate 11 and then the substrate is attached to a support member 12 with an adhesive 13. The support member provides mechanical rigidity and is also a thermal heatspreader. The substrate is typically a polyimide flex circuit or a printed wiring board. The support member has a recess 14, which provides a space to contain the die. The multi-step process; fabricate substrate, excise hole, and laminate heatspreader increases package cost and design complexity. As an option, the support member is electrically connected to the substrate circuitry to improve performance. This electrical connection requires additional process steps and materials during the substrate attachment process, and therefore adds cost. In U.S. Pat. No. 5,420,460 (Massingill) the edge of the stamped hole 15a is outside the recess, and in U.S. Pat. No. 5,869,889 (Chia et al) the edge of the stamped hole 15b is inside the recess. The die is adhesively attached to the support member, and wirebonds 16 electrically connect the die to the circuitry on the substrate. The recess, die and wirebonds are coated with epoxy encapsulation 17 for environmental protection. Package solder balls 18 are attached to the array of package pads to complete the package.

The process of making the recess, removes a portion or all of the substrate in the recess area, and therefore removes the capability of having substrate circuitry in the total recess area.

As the circuitry has been removed, the ability for attaching a die with solder balls is not available, and solder ball attached the die are not used.

As the clock rates and power of semiconductor die increase, power supply noise becomes a more serious problem. It becomes desirable to attach decoupling capacitors close to the die to minimize the effective inductances in the power supply distribution system. Approaches to accomplish this include mounting discrete capacitors on the subsystem circuit board adjacent to, or under the package, mounting discrete capacitors on the package, or providing thin organic dielectric layers in the package substrate. A drawback of discrete capacitors is the series inductance of the capacitors and the inductance from the routing to connect the capacitor limit its effectiveness to frequencies below 300 Mhz. A drawback of thin organic dielectric layers is the capacitance per unit area is small, typically less than 1 nF/cm^2, and is insufficient control power supply noise.

Consequently a need exists for a cavity-down ball grid array package, that allows substrate circuitry, does not have through vias, includes an integral electrically connected heatspreader that does not sandwich the die, mounts the die without a recess, allows electrical connections to the die with wirebond, TAB, or solder balls, allows the TCE of the substrate to be adjusted for optimum reliability, and provides a capacitor layer for controlling power supply noise.

SUMMARY OF THE INVENTION

It is an object of the invention to provide a cavity-down ball grid array package, which mounts the die without a recess.

It is a further object of the invention to fabricate the package with a reduce number of steps by including an integral heatspreader as part of the substrate, and to be able to control the TCE of the heatspreader to be close to the TCE of a die (2 ppm/C), to the TCE of a circuit board (18 ppm/C), or halfway between at 10 ppm/C, as required to improve the overall reliability of an electronic subsystem utilizing the invention.

It is a further object of the invention to use a substrate technology that does not require through vias which block routing, and to electrically connect the integral heatspreader as a ground or power plane to improve the electrical performance of the package without adding an additional patterned metal layer.

It is a further object of the invention to provide a capacitor layer as part of the substrate for decoupling power and ground layers, and controlling power supply noise.

It is a further object of the invention to provide electrical connections between the die and the substrate by wirebond or solder balls.

In accordance with these and other objectives of the invention, an improved cavity-down ball grid array package is disclosed. It is fabricated from a printed wiring board substrate, which includes an integral heatspreader. Further, the material for the heatspreader may be selected to determine the TCE of the package, and allows the design of the TCE of the package for improved system reliability. The substrate is formed without a recess, and includes an integral capacitor layer for decoupling power and ground layers. The die are thinned and are contained in the stand-off space provided by the package solder balls.

A printed wiring board is fabricated, which has a metal core and one or more thin build-up layers and a solder mask passivation layer. The metal core consists of a 4 layer stack; a thicker base metal, a thin anodizable metal layer, a thin metal oxide dielectric layer, and a thin top metal layer. Vias are opened in the dielectric layer for electrical connection to the base layer, and the top metal layer is patterned. Each buildup layer has an organic dielectric layer with vias and a patterned metal layer. The circuitry on the printed wiring board includes package bond pads for electrical connection to the integrated circuit die and package pads for electrical connections to an electronic circuit board. Conductive traces fanout from the package bond pads to an array of the package pads. The package pads are prepared with package solder balls to make a ball grid array (BGA) or as an option with package pins to make a pin grid array (PGA). A wafer of an integrated circuit die is thinned by back grinding to less than half the diameter of the package solder balls. The integrated circuit die is attached to the printed wiring board and is electrically connected to the printed wiring board with solder balls, or as an option with wire bonds. For solder ball connections, die bond pads on the front of the integrated circuit die are attached to the package bond pads on the printed wiring board with solder balls; epoxy is applied between and around the solder balls completely filling the gap between the die and the printed wiring board. This epoxy provides environmental protection to the die, and stress relief to the die solder balls. For wirebond connections, adhesive is used to connect the back of the die to the printed wiring board and wirebonds connect the die bond pads on the front surface of the die and to the package bond pads on the printed wiring board; epoxy is used to encapsulate and provide environmental protection to the die and wirebonds. The package is mounted and makes electrical contact to pads on an electronic subsystem circuit board by the package solder balls or the package pins.

Additional objectives, features and advantages of the various aspects of the present invention will become apparent from the following description of its Preferred Embodiments, which description should be taken in conjunction with the accompanying drawings.

BRIEF DESCRIPTION OF THE DRAWINGS

FIG. 1 is a cross-sectional view of a conventional cavity-down ball grid array.

FIG. 2 is a cross-sectional view of a first embodiment of the present invention with a solder ball attached die.

FIG. 3 is a cross-sectional view of a second embodiment of the present invention with a wirebond die.

DRAWING—REFERENCE NUMERALS

Figure 4:
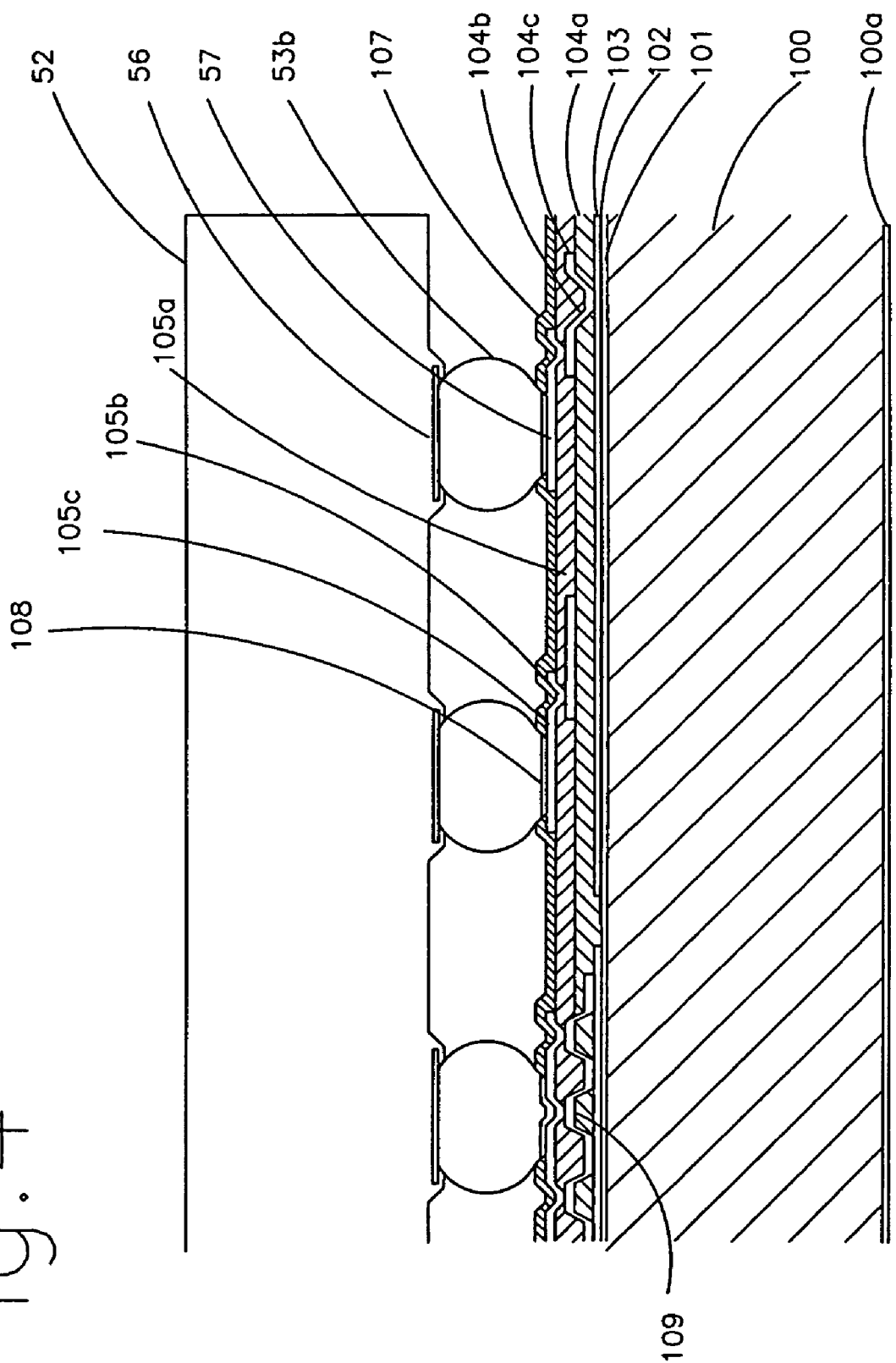
FIG. 4 is a cross-sectional view of the single sided printed wiring board of the present invention.
Figure 5:
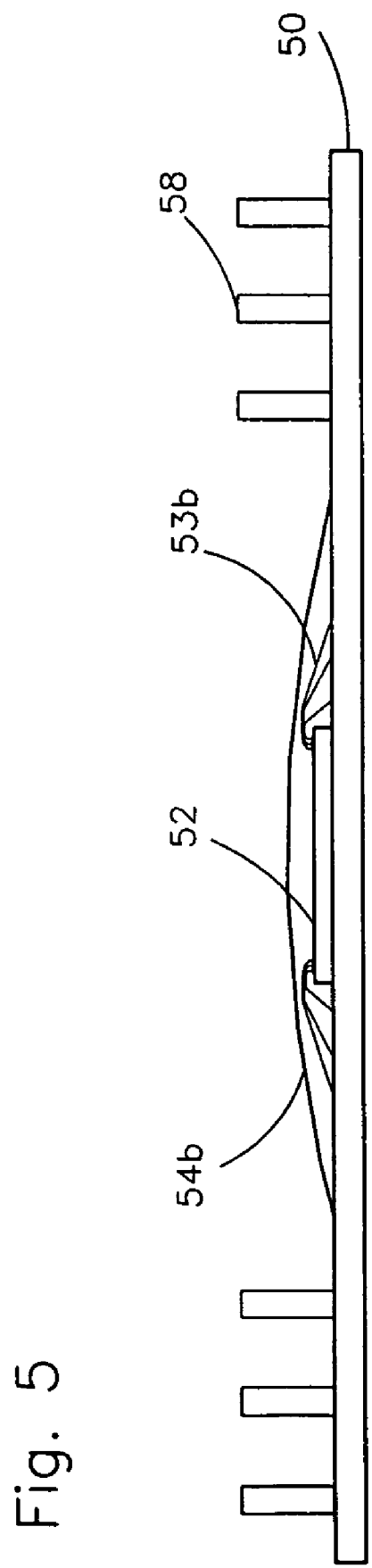
FIG. 5 is an alternate embodiment where the package solder balls are replaced with pins.

| | Prior Art |
|---|---|
| 10 | integrated circuit die |
| 11 | substrate |
| 12 | support member |
| 13 | adhesive |
| 14 | recess |
| 15a, 15b | edge of excised hole |

-continued

| | |
|---|---|
| 16 | wirebonds |
| 17 | epoxy encapsulation |
| 18 | package solder balls |
| | Present Invention |
| 50 | printed wiring board |
| 52 | integrated circuit die |
| 53a | die solder ball |
| 53b | wirebond |
| 54a | organic underfill |
| 54b | epoxy encapsulation |
| 55 | package solder ball |
| 56 | die bond pad |
| 57 | package bond pad |
| 58 | package pin |
| 59 | package pad |
| 60 | conductive trace |
| 100 | base metal |
| 100a | passivation layer |
| 101 | lower metal layer |
| 102 | dielectric layer |
| 103 | upper metal layer |
| 104a | epoxy dielectric (1st build-up layer) |
| 104b | via (1st build-up layer) |
| 104c | metal layer (1st build-up layer) |
| 105a | epoxy dielectric (2nd build-up layer) |
| 105b | via (2nd build-up layer) |
| 105c | metal layer (2nd build-up layer) |
| 107 | solder mask |
| 108 | coating |
| 109 | thermal via |

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover any alternatives, modifications and equivalents, which may be included within the spirit and scope of the invention as defined by the appended claims.

FIGS. 2 and 3 are cross-sectional views of a cavity-down ball grid array, and are the preferred embodiments of the present invention. In FIG. 2, the electrical connections between the die pads on the integrated circuit and the bond pads on the single sided printed wiring board are made by die solder balls 53a. The gap between the die and the printed wiring board is filled with an organic underfill 54a to reduce stress on the die solderballs and to add environmental protection. In FIG. 3, the electrical connections between die bond pads 56 on an integrated circuit 52 and package bond pads 57 on a single sided printed wiring board 50 are made by wirebonds 53b. An epoxy encapsulation 54b is coated over the die and wirebonds for environmental protection.

FIG. 4 is a cross-sectional view of the single-sided printed wiring board 50. The board has a metal core consisting of the base metal 100 and a core capacitor. The base metal is solid and made from copper or an alloy of copper, such as C194, and has a thickness between 0.20 mm and 1.00 mm. On the bottom of base metal there is an optional passivation layer 100a, such as an electro-plated nickel layer, or a black copper oxide layer. The core capacitor is fabricated on the surface of the base metal, and consists of a lower metal layer 101, a dielectric layer 102 and an upper metal layer 103 layer. The lower metal layer is deposited on the base metal by sputtering tantalum in a vacuum chamber, with a thickness of 1 micron. Tantalum is an anodizable metal, and the dielectric layer is formed by anodic oxidation of the tantalum followed by a 450 C. anneal and thermal oxidation, to provide a dielectric thickness of 0.2 microns. The dielectric is coated with photoresist, patterned and vias are etched with an HF/HNO3 solution. The upper metal layer is deposited on the dielectric layer by sputtering copper in a vacuum chamber, with a thickness of 1 to 3 microns.

On the upper layer of the capacitor is a first build-up layer comprising an epoxy dielectric 104a, vias 104b, and a patterned metal layer 104c. On the first build-up layer is a second build up layer comprising an epoxy dielectric 105a, vias 105b, and a patterned metal layer 105c. On the second build up layer is an organic solder mask layer 107, with pad openings exposing the metal layer of the second build-up layer. The metal in the pad opening has a coating 108 to contact the electrical connection to the die. When the die is connected with solder balls, the coating is electroless plated nickel, with a thickness of 100 to 200 uinch, and immersion gold, with a thickness of 1-10 inch. When the die is connected with wirebonds the coating is electroless plated nickel, with a thickness of 100 to 200 uinch, and electroless plated gold, with a thickness of 30-100 uinch.

There are multiple commercially available processes for producing the build-up layers, with variations in dielectric material, via formation and metal deposition and patterning. The preferred method is using an un-supported epoxy films or a glass fiber reinforced epoxy film for the dielectric, UV lasers to form the micro-vias, and metal deposition and patterning by electroless copper seed deposition, and pattern electro-plated copper for trace deposition. Other commercially available process are (1) liquid photo imageable epoxy, with photo developed vias, electroless copper seed deposition, and pattern electro-plated copper trace deposition or (2) resin coated copper dielectrics, laser micro vias and area electro-plated copper deposition with patterned subtractive etch copper traces. The solder mask material is a liquid photoimageable epoxy.

Figure 6:
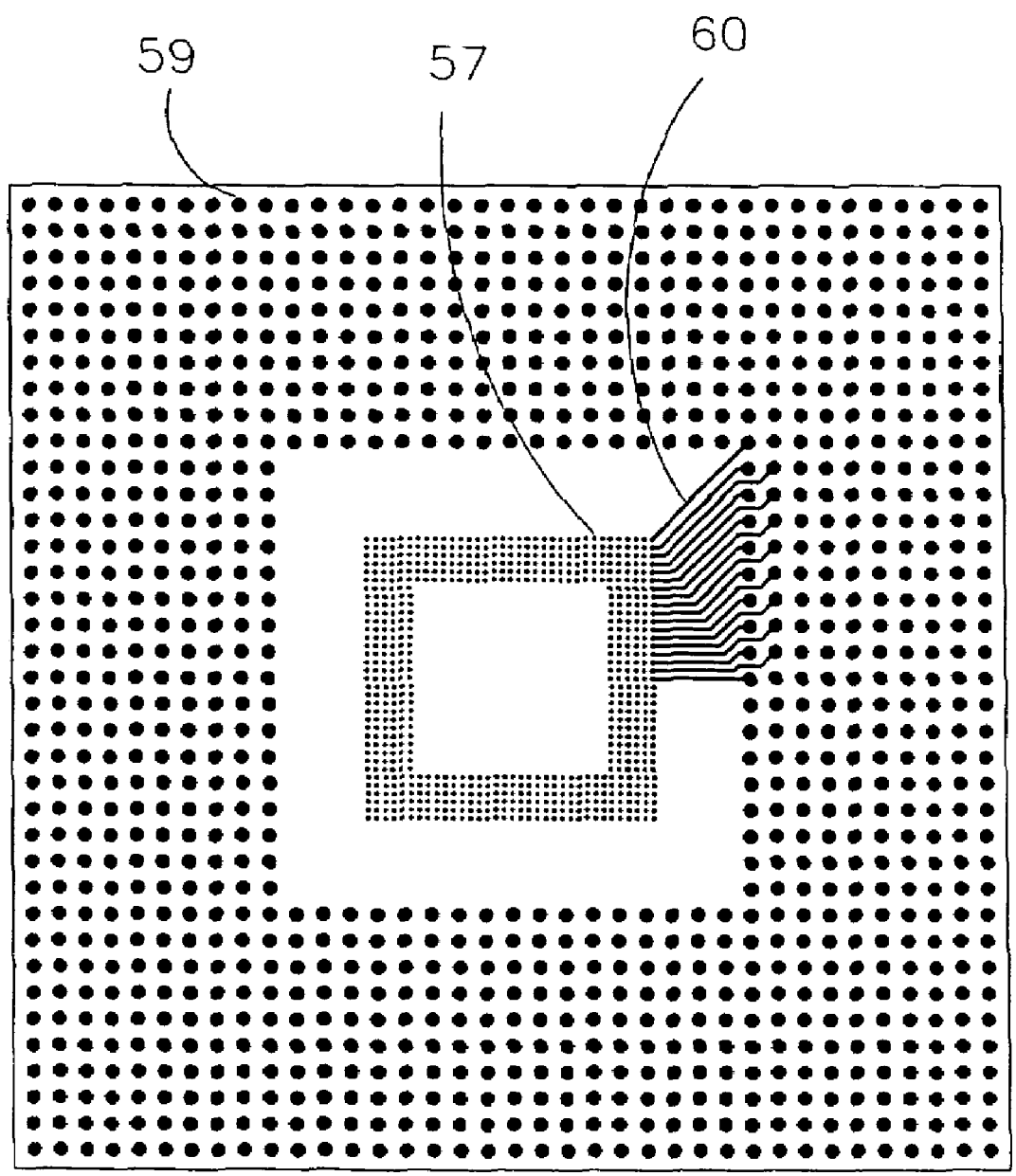
FIG. 6 is a planar view of the printed wiring board of the present invention showing the package pads in one row around the perimeter of the printed wiring board.
Figure 7:
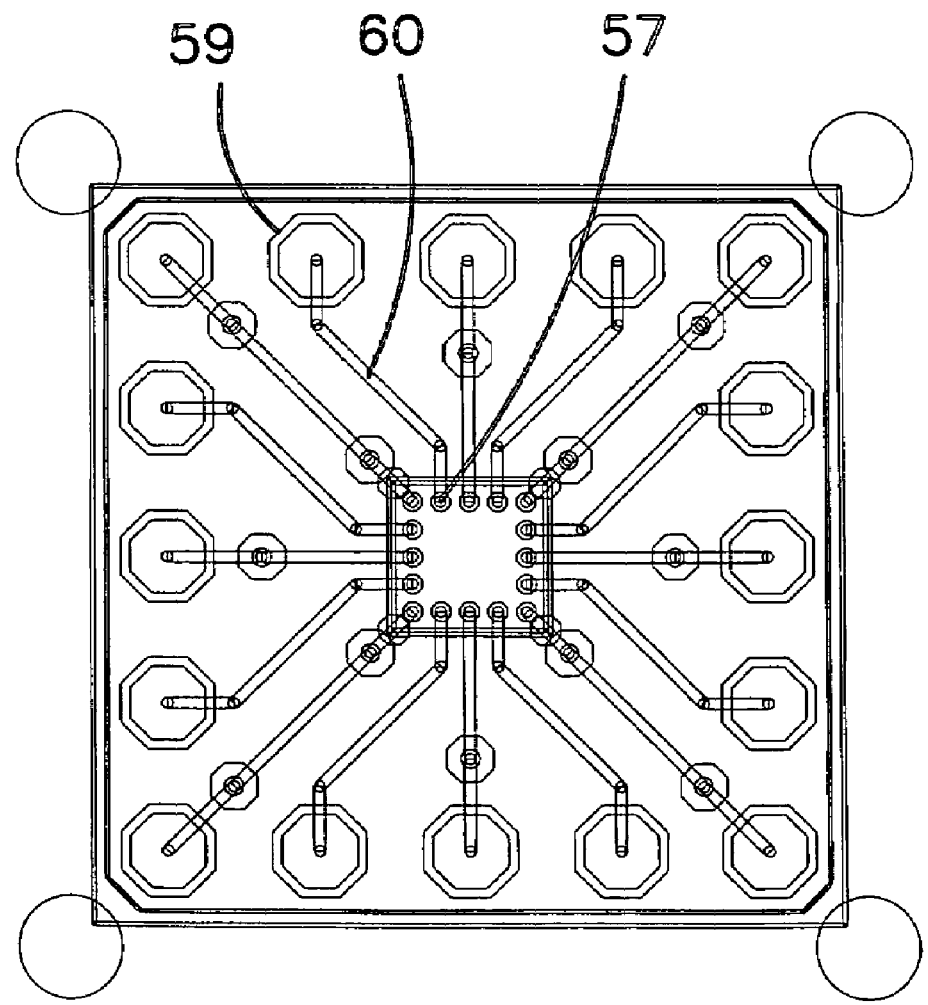
FIG. 7 is a planar view of the present invention with a solder ball attached die, and showing the package pads arranged in an array where the center of the array is not populated with package pads.

The circuit design of the printed wiring board includes package bond pads, package pads 59, conductive traces 60, conductive planes, and thermal vias. The package bond pads make electrical connection to the die with wire bond, TAB, or solder balls. The package pads make electrical connection to a circuit board in an electronic subsystem, with package solder balls 55 to make a ball grid array or package pins 58 to make a pin grid array. The package bond pads and package pads are connected to other package pads, other package bond pads or the metal core with conductive traces, conductive planes, and vias. The package pads are arranged in a pattern, with a matching pattern on the subsystem circuit board. FIG. 6 shows the package pads arranged in an array, with the center of the array not populated with package pads, but with the center of the array containing package bond pads for connection to the die. FIG. 7 shows the package pads arranged in one row around the perimeter of the printed wiring board.

Under the die there may be thermal vias 109 to the metal core, these are thermal metal pads and vias that provide a metallic thermal conduction path from the die to the metal core. These thermal vias and conduction paths need not, but may also connect to electrical circuits of the design. With or without thermal vias the metal core is an integral heatspreader for the die. Heat from the die is conducted into the metal core, and radiated out from the back of the metal core and also conducted from the metal core into the package solder balls and into the subsystem circuit board.

For a solder ball attached die the thermal heat flow is from the active surface of the integrated circuit, through the solder balls and underfill, through thermal vias and into the metal core. In comparison a conventional BGA with a solder ball attached die on an organic substrate, the thermal heat flow is from the active surface, through the silicon substrate, through a heatspreader adhesive and into the heatspreader. A separate heatspreader, heatspreader adhesive and attachment process are eliminated with the invention.

The printed wiring board described has an unbalanced TCE. The TCE of the epoxy layers is higher than the metal core, and only on a single side. Unbalanced TCE structures can warp and bow, so a TCE matching layer may be included on the opposite side of the metal core to make a balanced TCE structure. This matching layer may be attached during fabrication of the printed wiring board by lamination of dielectric layers to the back of the metal core or after die assembly with a screened or dispensed liquid epoxy.

When mounted the package solder balls collapse and provide a standoff less than their nominal diameter. The integrated circuit die must be thinned to accommodate the standoff provided by the package solder balls. Die thinning is done at the wafer level by back grinding, a standard semiconductor die assembly process. For wire bond connected die this must include the die thickness, the die attach adhesive thickness, the wire bond loop, the passivation, and a clearance. For a wire bond connected die and package solder balls on an 1.0 mm pitch, with a 0.5 mm nominal diameter package solder ball and a 25% collapse, with a 0.10 mm die attach adhesive, a 0.075 mm wirebond loop, a 0.125 mm passivation, and a 0.100 mm clearance, then the die needs to be thinned to 0.125 mm. For a solder ball connected die this must include the die thickness, the die solder ball diameter and a clearance. For a solder ball connected die and package solder balls on an 0.8 mm pitch, with a 0.4 mm nominal diameter package solder ball and a 25% collapse, with a 0.75 mm die solderballs and a 0.100 mm clearance, then the die needs to be thinned to 0.125 mm.

Standard semiconductor die assembly process is used to mount, make electrical connection to, and passivate the die, and to prepare the package pads. For wirebond connections, adhesive is used to connect the back of the die to the printed wiring board and wirebonds attach to the die bond pads on the front surface of the die and to the package bond pads on the printed wiring board; epoxy is used to encapsulate and provide environmental protection to the die and wirebonds. For solder ball connections, die bond pads on the front of the die are attached to the package bond pads on the printed wiring board with solder balls; epoxy is applied between and around the solder balls completely filling the gap between the die and the printed wiring board. The package pads are prepared with solder balls to make a ball grid array or as an option with pins to make a pin grid array.

Although several preferred embodiments have been described in detail herein with reference to accompanying drawings, it is to be understood that the invention is not limited to these precise embodiments, and that various changes and modifications may be effected therein by one skilled in the art without departing from the scope or spirit of the invention as defined in the appended claims.

What is claimed:

1. A semiconductor package assembly, comprising:
    an integrated circuit die having on one side electrical contact pads for external connection and a thickness;
    a substantially planar substrate having patterned circuitry on a dielectric layer over a metal core;
    first solder balls joining individual ones of the electrical contact pads on the die to portions of the patterned circuitry in a first area of the substantially planar substrate for mounting the die to the substrate; and
    second solder balls affixed to the patterned circuitry on the substrate outside the area for mounting the die to the substrate, on the same side of the substrate that the die is mounted;
    wherein the second solder bails have a common diameter at least twenty-five percent greater than the common diameter of the first solder balls plus the thickness of the die.

2. The assembly of claim 1 further comprising one or more metal-filled vias passing through the dielectric layer on the substrate at the location of individual ones of the first solder balls.

3. The assembly of claim 1 further comprising a capacitor layer on the side of the substrate mounting the die, the capacitor layer formed by a dielectric layer between two metal layers.

4. The assembly of claim 1 further comprising a layer of one or more materials on a side of the substrate opposite the side mounting the die, with a thermal coefficient of expansion substantially the same as the materials on the side mounting the die, avoiding unequal expansion.

5. A semiconductor package assembly, comprising:
    a substantially planar substrate having patterned circuitry on a dielectric layer over a metal core, the circuitry formed in a manner providing a circuitry-free area for mounting a die;
    an integrated circuit die having on one side electrical contact pads for external connection and a thickness, the die applied to the substrate on the side of the dielectric layer and in the circuitry-free area, with the die contact pads facing away from the substrate;
    wires bonded between individual ones of the electrical contact pads of the die and the patterned circuitry on the substrate outside the circuitry-free area, the wires constrained within a specific height above the die; and
    solder balls affixed to the patterned circuitry at specific points on the substrate outside the circuitry-free area for mounting the die to the substrate, on the same side of the substrate that the die is mounted;
    wherein the solder balls have a common diameter at least twenty-five percent greater than the thickness of the die plus the specific height above the die encompassing the wires.

6. The assembly of claim 5 further comprising one or more metal-filed vias passing through the dielectric layer on the substrate at locations beneath the die mounted in the circuitry-free area.

7. The assembly of claim 5 further comprising a capacitor layer on the side of the substrate mounting the die, the capacitor layer formed by a dielectric layer between two metal layers.

8. The assembly of claim 5 further comprising a layer of one or more materials on a side of the substrate opposite the side mounting the die, with a thermal coefficient of expansion substantially the same as the materials on the side mounting the die, avoiding unequal expansion.

* * * * *